(12) United States Patent
Yeh et al.

(10) Patent No.: US 12,342,561 B2
(45) Date of Patent: Jun. 24, 2025

(54) HIGH-ELECTRON MOBILITY TRANSISTOR AND FABRICATION METHOD THEREOF

(71) Applicant: UNITED MICROELECTRONICS CORP., Hsin-Chu (TW)

(72) Inventors: Chih-Tung Yeh, Taoyuan (TW); Wen-Jung Liao, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 490 days.

(21) Appl. No.: 17/876,552

(22) Filed: Jul. 29, 2022

(65) Prior Publication Data

US 2024/0006511 A1     Jan. 4, 2024

(30) Foreign Application Priority Data

Jun. 30, 2022  (CN) .......................... 202210766966.0

(51) Int. Cl.
*H10D 30/01*  (2025.01)
*H01L 23/31*  (2006.01)
*H10D 30/47*  (2025.01)
*H10D 62/85*  (2025.01)

(52) U.S. Cl.
CPC ....... *H10D 30/015* (2025.01); *H01L 23/3171* (2013.01); *H01L 23/3192* (2013.01); *H10D 30/47* (2025.01); *H10D 62/8503* (2025.01)

(58) Field of Classification Search
CPC .. H10D 30/015; H10D 30/47; H10D 62/8503; H10D 30/475; H10D 62/113; H10D 62/343; H10D 62/53; H10D 64/411; H01L 23/3171; H01L 23/3192; H01L 21/56; H01L 23/3185; H01L 23/291; H01L 23/60
See application file for complete search history.

(56) References Cited

U.S. PATENT DOCUMENTS 9,337,332 B2 *  5/2016  Chu ..................... H10D 30/475
9,508,842 B2 * 11/2016  Miyake ............... H10D 30/015
9,633,920 B2    4/2017  Chiu

OTHER PUBLICATIONS

Pearton ,"Electrical passivation in hydrogen plasma exposed GaN" Electronics Letters Mar. 17, 1994 vol. 30 No. 6, pp. 527-528.

* cited by examiner

*Primary Examiner* — David Vu
(74) *Attorney, Agent, or Firm* — Winston Hsu

(57) ABSTRACT

A high-electron mobility transistor includes a substrate, a buffer layer over the substrate, a barrier layer over the buffer layer, and a gate structure on the barrier layer. The gate structure includes a cap layer and a gate over the cap layer. The cap layer includes a gate-leakage suppressing region on its sidewall.

12 Claims, 6 Drawing Sheets

HIGH-ELECTRON MOBILITY TRANSISTOR AND FABRICATION METHOD THEREOF

BACKGROUND OF THE INVENTION

1. Field of the Invention

The present invention relates to the field of semiconductor technology, and in particular, to a gallium nitride (GaN) high-electron mobility transistor (HEMT) and a fabrication method thereof.

2. Description of the Prior Art

High-electron mobility transistors (HEMTs) are known in the art. GaN HEMTs are widely used in high-frequency, high-power amplifier components due to high breakdown voltage, high saturation electron moving speed and high operation temperature.

In a typical HEMT, for example, a two-dimensional electron gas (2DEG) is generated at a semiconductor heterojunction. The 2DEG represents a very thin conduction layer of highly mobile and highly concentrated charge carriers free to move readily in the two dimensions of that conduction layer, but constrained from movement in a third dimension perpendicular to the conduction layer.

Prior art HEMT devices suffer from gate leakage problems because high forward gate bias leads to potential difference build up between Schottky metal and p-type GaN layers. On the side close to the p-type GaN layer is a metal-insulator-semiconductor (MIS) junction, and a fringing field causes an inversion channel to be formed on the sidewall of the p-type GaN layer.

SUMMARY OF THE INVENTION

It is one object of the present invention to provide an improved high-electron mobility transistor which can overcome the shortcomings or deficiencies of the prior art.

One aspect of the invention provides a high-electron mobility transistor including a substrate, a buffer layer over the substrate, a barrier layer over the buffer layer, and a gate structure on the barrier layer. The gate structure includes a cap layer and a gate over the cap layer. The cap layer includes a gate-leakage suppressing region on its sidewall.

According to some embodiments, the gate-leakage suppressing region is an implanted region.

According to some embodiments, the implanted region is an Ar-implanted region.

According to some embodiments, the gate-leakage suppressing region has a width of 0.5 micrometers.

According to some embodiments, the gate-leakage suppressing region has a depth of about at least two third of a thickness of the cap layer.

According to some embodiments, the buffer layer is a GaN layer.

According to some embodiments, the barrier layer is an AlGaN layer.

According to some embodiments, the cap layer is a p-type GaN layer.

According to some embodiments, the gate comprises nickel, gold, silver, titanium, copper, platinum or alloys thereof.

According to some embodiments, the high-electron mobility transistor further includes a passivation layer covering the barrier layer, the gate-leakage suppressing region and the gate. The passivation layer is in direct contact with the gate-leakage suppressing region.

According to some embodiments, the passivation layer comprises aluminum nitride, aluminum oxide, silicon nitride, or silicon oxide.

According to some embodiments, the high-electron mobility transistor further includes a source region and a drain region on opposite sides of the gate structure. A source contact layer and a drain contact layer are disposed on the barrier layer within the source region and the drain region, respectively.

Another aspect of the invention provides a method for forming a high-electron mobility transistor. A substrate is provided. A buffer layer is formed over the substrate. A barrier layer is formed over the buffer layer. A gate structure is formed on the barrier layer. The gate structure includes a cap layer and a gate over the cap layer. After forming the gate structure, an ion implantation process is performed to form a gate-leakage suppressing region on a sidewall of the cap layer.

According to some embodiments, the method further comprises the step of depositing a passivation layer conformally covering the barrier layer and the gate structure before performing the ion implantation process.

According to some embodiments, the passivation layer comprises aluminum nitride, aluminum oxide, silicon nitride, or silicon oxide.

According to some embodiments, an implanted source of the ion implantation process comprises argon.

According to some embodiments, the gate-leakage suppressing region has a width of 0.5 micrometers.

According to some embodiments, the gate-leakage suppressing region has a depth of about at least two third of a thickness of the cap layer.

According to some embodiments, the buffer layer is a GaN layer.

According to some embodiments, the barrier layer is an AlGaN layer.

According to some embodiments, the cap layer is a p-type GaN layer.

According to some embodiments, the gate comprises nickel, gold, silver, titanium, copper, platinum or alloys thereof.

Still another aspect of the invention provides a method for forming a high-electron mobility transistor. A substrate is prepared. A buffer layer is formed over the substrate. A barrier layer is formed over the buffer layer. The barrier layer is subjected to an ion implantation process. A gate structure is formed on the barrier layer. The gate structure comprises a cap layer and a gate over the cap layer. A gate-leakage suppressing region is disposed on a sidewall of the cap layer. A passivation layer is deposited to conformally cover the barrier layer and the gate structure.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
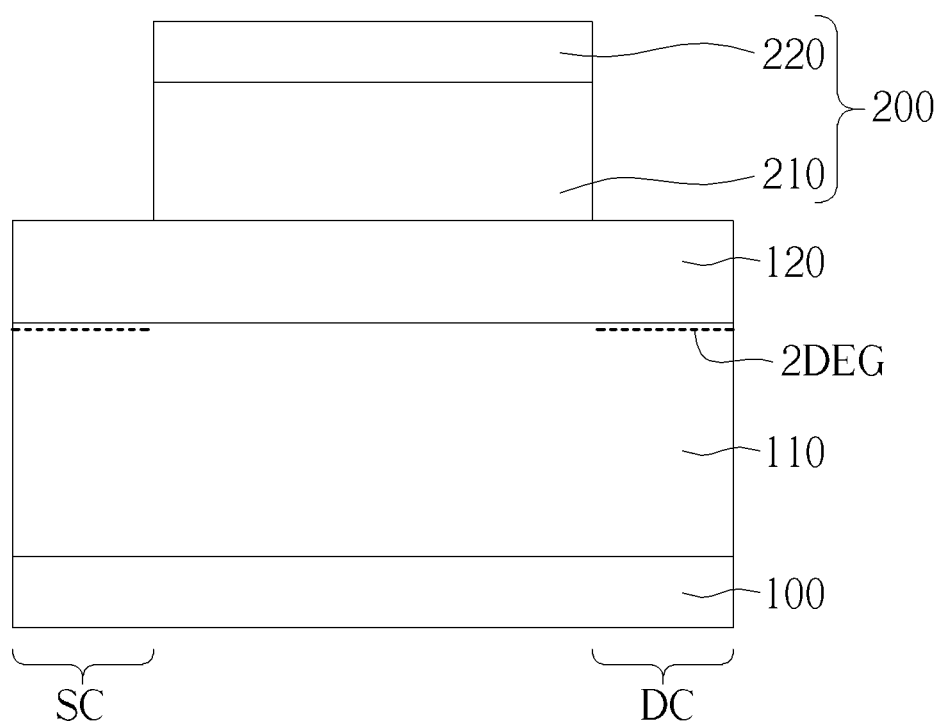
FIG. 1 to FIG. 3 are schematic cross-sectional views illustrating a method for forming a high-electron mobility transistor according to an embodiment of the present invention.
Figure 2:
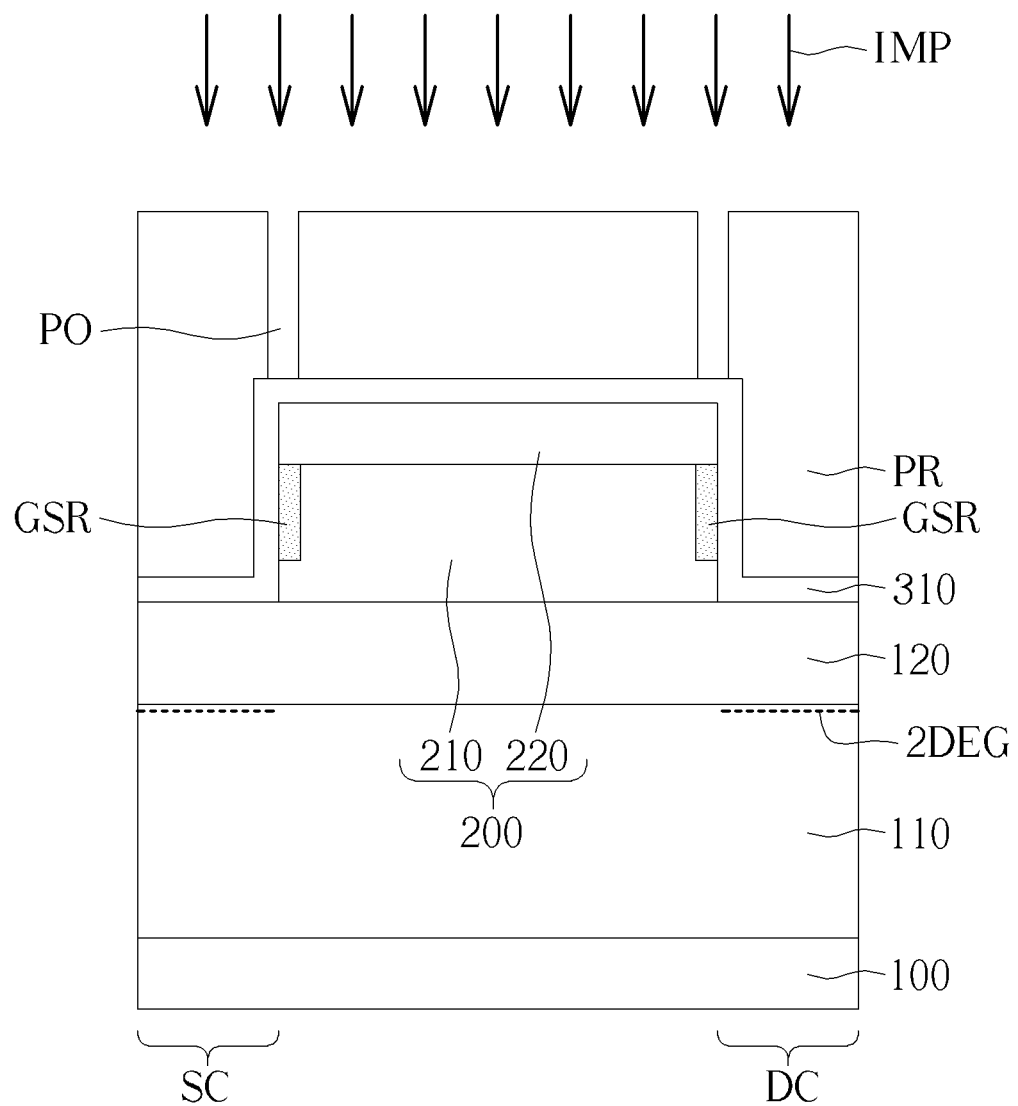
Figure 3:
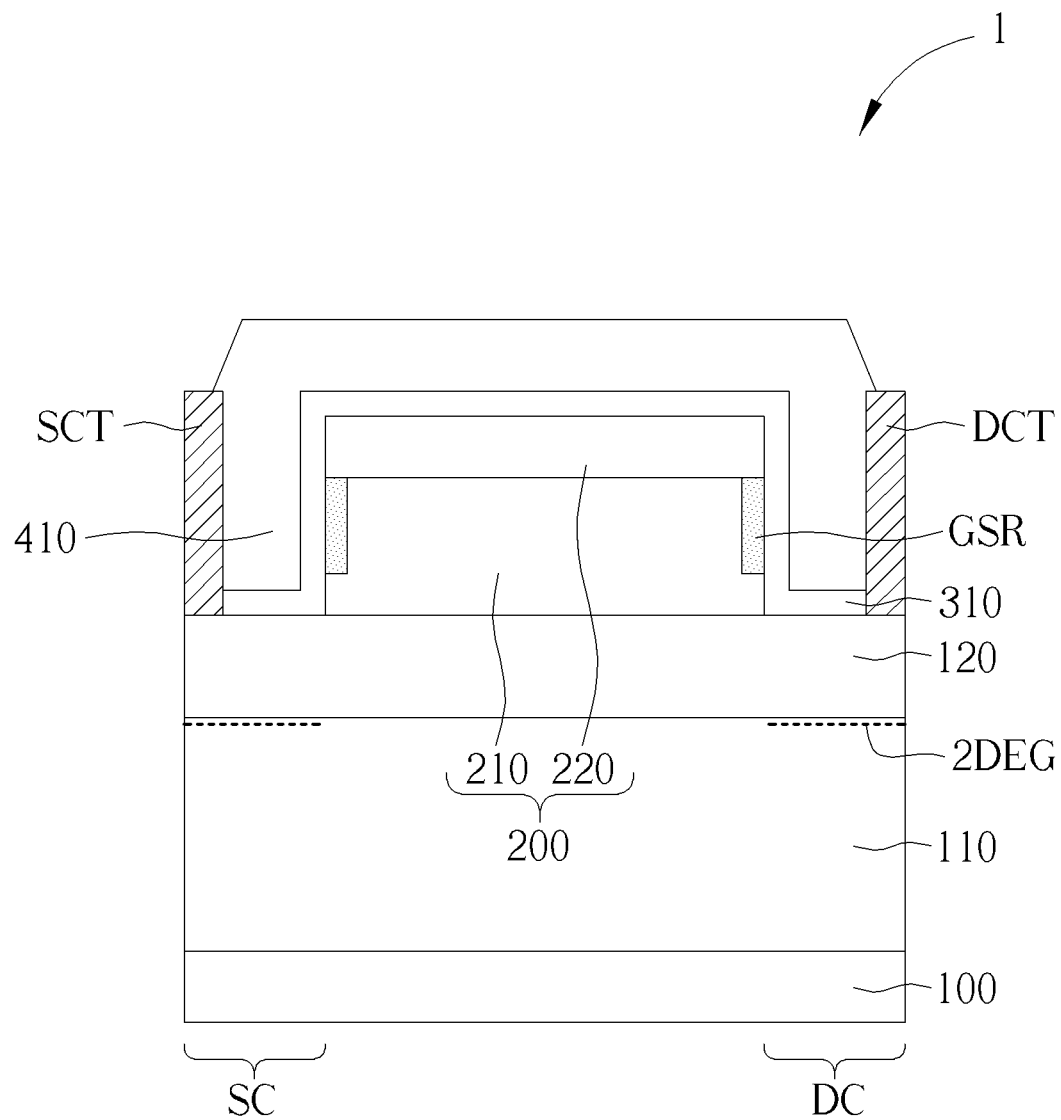

Please refer to FIG. 1 to FIG. 3, which are schematic cross-sectional views of a method for forming a high-electron mobility transistor 1 according to an embodiment of the present invention. As shown in FIG. 1, a substrate 100 is provided. For example, the substrate 100 may be a conductive substrate. For example, the substrate 100 may be a silicon substrate, but is not limited thereto. A buffer layer 110 is then formed on the substrate 100. According to an embodiment of the present invention, for example, the buffer layer 110 may be a GaN layer, but is not limited thereto. Subsequently, a barrier layer 120 is formed on the buffer layer 110. According to an embodiment of the present invention, for example, the barrier layer may be an AlGaN layer, but is not limited thereto. A two-dimensional electron gas 2DEG may be formed at the interface between the barrier layer 120 and the buffer layer 110.

Subsequently, a gate structure 200 is formed on the barrier layer 120. According to an embodiment of the present invention, the gate structure 200 includes a cap layer 210 and a gate 220 over the cap layer 210. According to an embodiment of the present invention, for example, the cap layer 210 may be a p-type GaN layer. According to embodiments of the present invention, for example, the gate 220 may include nickel, gold, silver, titanium, copper, platinum, or alloys thereof.

As shown in FIG. 2, after the gate structure 200 is formed, a passivation layer 310 is deposited on the substrate 100, so that the passivation layer 310 conformally covers the barrier layer 120 and the gate structure 200. According to embodiments of the present invention, for example, the passivation layer 310 may include aluminum nitride, aluminum oxide, silicon nitride, or silicon oxide.

Subsequently, a photoresist pattern PR is formed on the passivation layer 310. The photoresist pattern PR has an opening PO that is located at the edge of the gate structure 200. Next, an ion implantation process IMP is performed, and dopants are implanted into the cap layer 210 through the opening PO, thereby forming a gate-leakage suppressing region GSR on the sidewall of the cap layer 210. According to an embodiment of the present invention, the ion implantation process IMP may include an oblique angle ion implantation process.

According to an embodiment of the present invention, for example, the implantation source of the ion implantation process IMP may include argon. By bombardment of argon ions, the structure at the sidewall of the cap layer 210 is damaged, and defects are generated to form a high-resistance region.

According to embodiments of the present invention, for example, the implantation source of the ion implantation process IMP may include nitrogen, oxygen, hydrogen, fluorine, helium, argon, magnesium, zinc, phosphorus, iron, krypton, xenon, boron, arsenic, or any combination thereof.

According to an embodiment of the present invention, for example, the width of the gate-leakage suppressing region GSR may be about 0.5 micrometers. According to an embodiment of the present invention, for example, the depth of the gate-leakage suppressing region GSR may be about at least two-thirds of the thickness of the cap layer 210.

As shown in FIG. 3, the photoresist pattern PR is then removed, and a dielectric layer 410 is deposited on the passivation layer 310. A source contact layer SCT and a drain contact layer DCT are formed in the dielectric layer 410 and the passivation layer 310 within the source region SC and the drain region DC on opposite sides of the gate structure 200, respectively.

Structurally, as shown in FIG. 3, the high-electron mobility transistor 1 of the present invention includes a substrate 100; a buffer layer 110 located on the substrate 100; a barrier layer 120 located on the buffer layer 110; and a gate structure 200 located on the barrier layer 120. The gate structure 200 includes a cap layer 210 and a gate 220 located above the cap layer 210. The cap layer 210 includes gate-leakage suppressing regions GSR on its sidewalls. According to an embodiment of the present invention, the gate-leakage suppressing region GSR is an ion implanted region, for example, an Ar implanted region.

According to an embodiment of the present invention, the width of the gate-leakage suppressing region GSR is 0.5 μm. According to an embodiment of the present invention, the depth of the gate-leakage suppressing region GSR is at least two-thirds of the thickness of the cap layer 210.

According to an embodiment of the present invention, the buffer layer 110 may be a GaN layer. According to an embodiment of the present invention, the barrier layer 120 may be an AlGaN layer. According to an embodiment of the present invention, the cap layer 210 may be a p-type GaN layer. According to an embodiment of the present invention, the gate 220 may include nickel, gold, silver, titanium, copper, platinum or an alloy thereof.

According to an embodiment of the present invention, the high-electron mobility transistor 1 further includes a passivation layer 310 covering the barrier layer 120, the gate-leakage suppressing region GSR and the gate 220. The passivation layer 310 is in direct contact with the gate-leakage suppressing region GSR. According to an embodiment of the present invention, the passivation layer 310 may include aluminum nitride, aluminum oxide, silicon nitride or silicon oxide.

According to an embodiment of the present invention, the high-electron mobility transistor 1 further includes: a source region SC and a drain region DC, located on opposite sides of the gate structure 200; and a source contact layer SCT and a drain contact layer DCT on the barrier layer 120 in the source region SC and the drain region DC, respectively.

Figure 4:
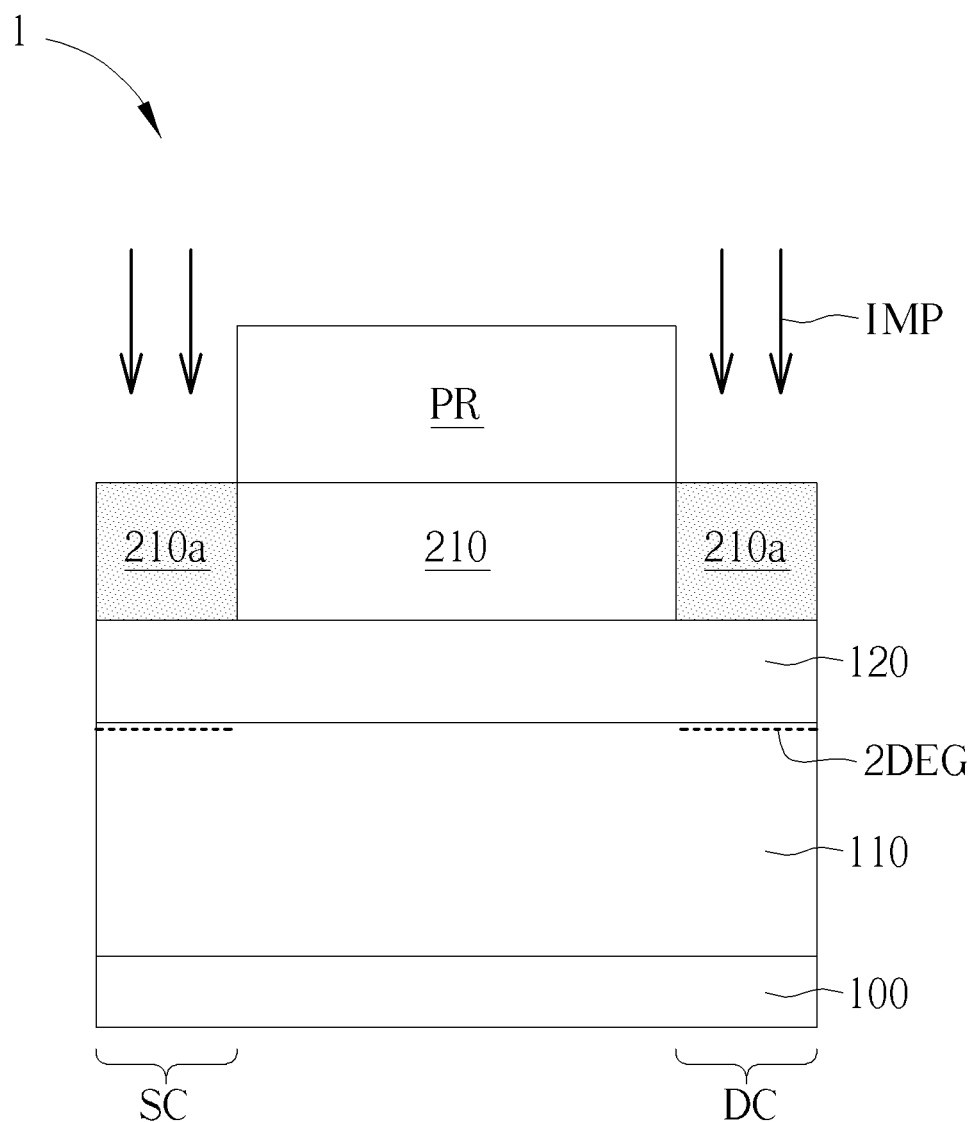
FIG. 4 to FIG. 6 are schematic cross-sectional views illustrating a method for forming a high-electron mobility transistor according to another embodiment of the present invention.
Figure 5:
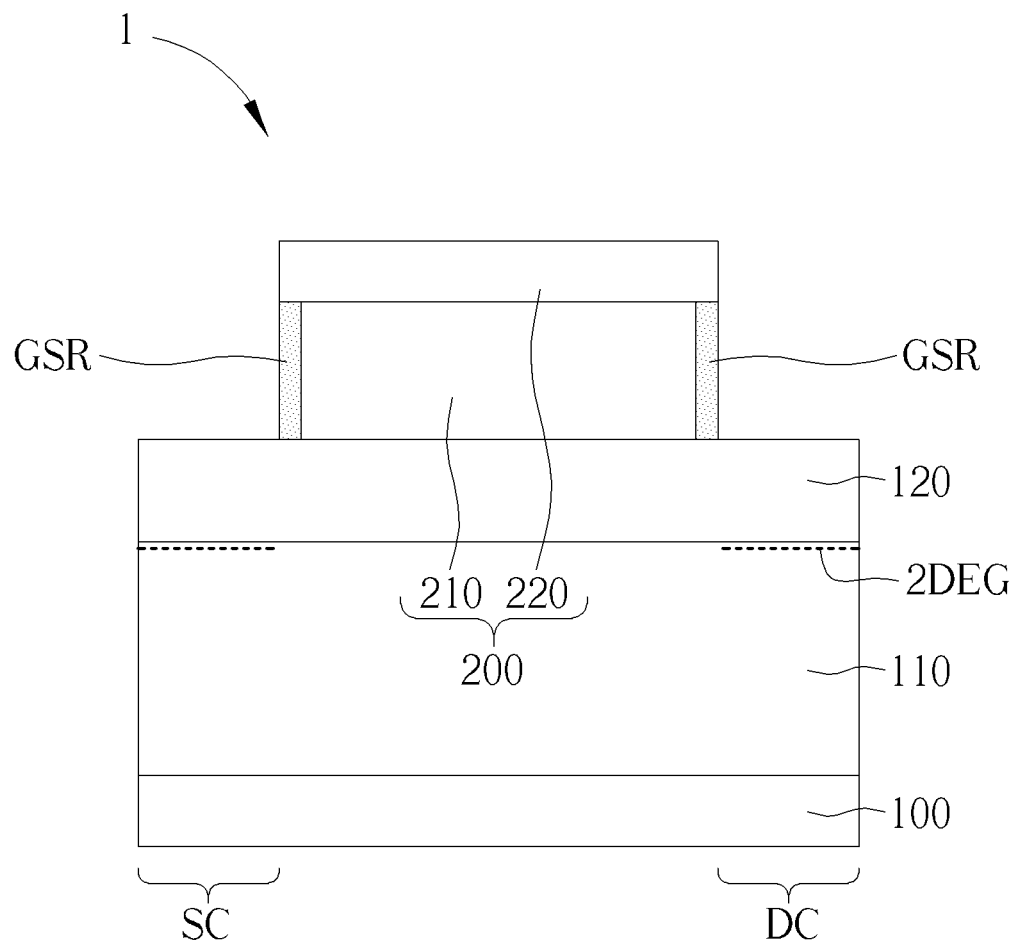
Figure 6:
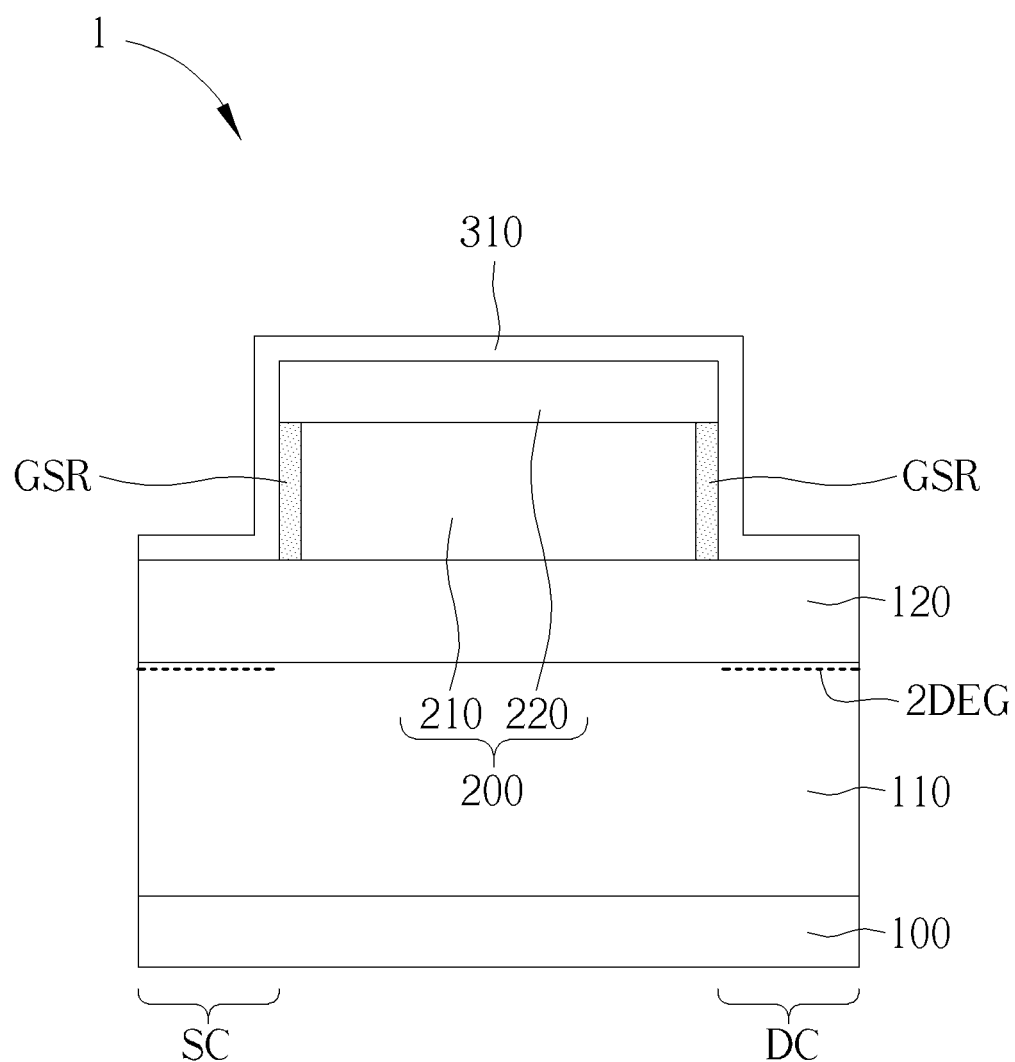

Please refer to FIG. 4 to FIG. 6, which are schematic cross-sectional views of a method for forming a high-electron mobility transistor 1 according to another embodiment of the present invention. As shown in FIG. 4, a substrate 100 is provided. For example, the substrate 100 may be a conductive substrate. For example, the substrate 100 may be a silicon substrate, but is not limited thereto.

Next, a buffer layer 110 is formed on the substrate 100. According to an embodiment of the present invention, for example, the buffer layer 110 may be a GaN layer, but is not limited thereto. Then, a barrier layer 120 is formed on the buffer layer 110. According to an embodiment of the present invention, for example, the barrier layer 120 may be an AlGaN layer, but is not limited thereto. At the interface between the barrier layer 120 and the buffer layer 110, a two-dimensional electron cloud 2DEG is formed.

Next, a cap layer 210 is formed on the barrier layer 120. According to an embodiment of the present invention, for example, the cap layer 210 may be a p-type GaN layer. Subsequently, a photoresist pattern PR is formed on the cap layer 210. Next, an ion implantation process IMP is performed to implant dopants into the cap layer 210 not covered by the photoresist pattern PR, thereby forming an implantation region 210a. Then, the photoresist pattern PR is removed.

According to an embodiment of the present invention, for example, the implantation source of the ion implantation process IMP may include argon. According to embodiments of the present invention, for example, the implantation source of the ion implantation process IMP may include nitrogen, oxygen, hydrogen, fluorine, helium, argon, magnesium, zinc, phosphorus, iron, krypton, xenon, boron, arsenic, or any combination thereof.

As shown in FIG. 5, a metal layer is deposited on the cap layer 210, and then a photolithography process and an etching process are performed to form the gate structure 200. According to an embodiment of the present invention, the gate structure 200 includes a cap layer 210 and a gate 220 above the cap layer 210. According to embodiments of the present invention, for example, the gate 220 may include nickel, gold, silver, titanium, copper, platinum, or alloys thereof. The cap layer 210 includes a gate-leakage suppressing region GSR (formed by the unetched implant region 210a) on its sidewalls. According to an embodiment of the present invention, the gate-leakage suppressing region GSR is an ion implanted region, for example, an Ar implanted region.

According to an embodiment of the present invention, the width of the gate-leakage suppressing region GSR is 0.5 μm. According to an embodiment of the present invention, the depth of the gate-leakage suppressing region GSR is at least two-thirds of the thickness of the cap layer 210. According to an embodiment of the present invention, the depth of the gate-leakage suppressing region GSR may equal to the entire thickness of the cap layer 210.

As shown in FIG. 6, after the gate structure 200 is formed, a passivation layer 310 is deposited on the substrate 100, so that the passivation layer 310 conformally covers the barrier layer 120 and the gate structure 200. According to embodiments of the present invention, for example, the passivation layer 310 may include aluminum nitride, aluminum oxide, silicon nitride, or silicon oxide. According to an embodiment of the present invention, the passivation layer 310 is in direct contact with the gate-leakage suppressing region GSR.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-electron mobility transistor, comprising:
    a substrate;
    a buffer layer over the substrate;
    a barrier layer over the buffer layer; and
    a gate structure on the barrier layer, wherein the gate structure comprises a cap layer and a gate over the cap layer, wherein the cap layer comprises a gate-leakage suppressing region on its sidewall.

2. The high-electron mobility transistor according to claim 1, wherein the gate-leakage suppressing region is an implanted region.

3. The high-electron mobility transistor according to claim 2, wherein the implanted region is an Ar-implanted region.

4. The high-electron mobility transistor according to claim 1, wherein the gate-leakage suppressing region has a width of 0.5 micrometers.

5. The high-electron mobility transistor according to claim 1, wherein the gate-leakage suppressing region has a depth of about at least two third of a thickness of the cap layer.

6. The high-electron mobility transistor according to claim 1, wherein the buffer layer is a GaN layer.

7. The high-electron mobility transistor according to claim 1, wherein the barrier layer is an AlGaN layer.

8. The high-electron mobility transistor according to claim 1, wherein the cap layer is a p-type GaN layer.

9. The high-electron mobility transistor according to claim 1, wherein the gate comprises nickel, gold, silver, titanium, copper, platinum or alloys thereof.

10. The high-electron mobility transistor according to claim 1 further comprising:
    a passivation layer covering the barrier layer, the gate-leakage suppressing region and the gate, wherein the passivation layer is in direct contact with the gate-leakage suppressing region.

11. The high-electron mobility transistor according to claim 10, wherein the passivation layer comprises aluminum nitride, aluminum oxide, silicon nitride, or silicon oxide.

12. The high-electron mobility transistor according to claim 1 further comprising:
    a source region and a drain region on opposite sides of the gate structure; and
    a source contact layer and a drain contact layer on the barrier layer within the source region and the drain region, respectively.

* * * * *